(12) United States Patent
Chen et al.

(10) Patent No.: US 9,844,111 B1
(45) Date of Patent: Dec. 12, 2017

(54) DIMMABLE LED DRIVING SYSTEM AND METHOD FOR REDUCING FLICKER

(71) Applicant: Marvell International Ltd., Hamilton (BM)

(72) Inventors: Yupeng Chen, Singapore (SG); Edy Susanto, Singapore (SG)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/219,164

(22) Filed: Jul. 25, 2016

Related U.S. Application Data

(60) Provisional application No. 62/196,493, filed on Jul. 24, 2015.

(51) Int. Cl.
*H05B 33/08* (2006.01)
*H03K 7/08* (2006.01)

(52) U.S. Cl.
CPC .......... *H05B 33/0845* (2013.01); *H03K 7/08* (2013.01); *H05B 33/083* (2013.01); *H05B 33/0815* (2013.01); *H05B 33/0839* (2013.01)

(58) Field of Classification Search
CPC ............ H05B 33/0845; H05B 33/0815; H05B 33/083
See application file for complete search history.

(56) References Cited

U.S. PATENT DOCUMENTS

| | | | |
|---|---|---|---|
| 8,853,964 B2 | 10/2014 | Sutardja et al. | |
| 9,131,567 B2 | 9/2015 | Zhang | |
| 9,320,097 B2 | 4/2016 | Zhang et al. | |
| 9,343,957 B1 | 5/2016 | Chui et al. | |
| 2010/0219764 A1* | 9/2010 | Yamasaki | H05B 33/0818 315/224 |
| 2013/0147356 A1* | 6/2013 | Masumoto | H05B 37/02 315/121 |
| 2013/0293134 A1* | 11/2013 | Ishikita | H05B 33/0839 315/210 |
| 2014/0320100 A1* | 10/2014 | Congiu | H02M 3/157 323/282 |

\* cited by examiner

*Primary Examiner* — Tung X Le
*Assistant Examiner* — Raymond R Chai

(57) ABSTRACT

A method of controlling a dimmable light emitting diode (LED) system includes defining two or more dimming regions having respective dimming levels applied to one or more strings of LEDs, continuously supplying a current to the one or more strings of LEDs in a first dimming region, and maintaining an average peak value of the current substantially the same and adjusting a duty cycle of a pulse width modulation (PWM) control signal in a second dimming region to supply the current according to the PWM control signal.

20 Claims, 7 Drawing Sheets

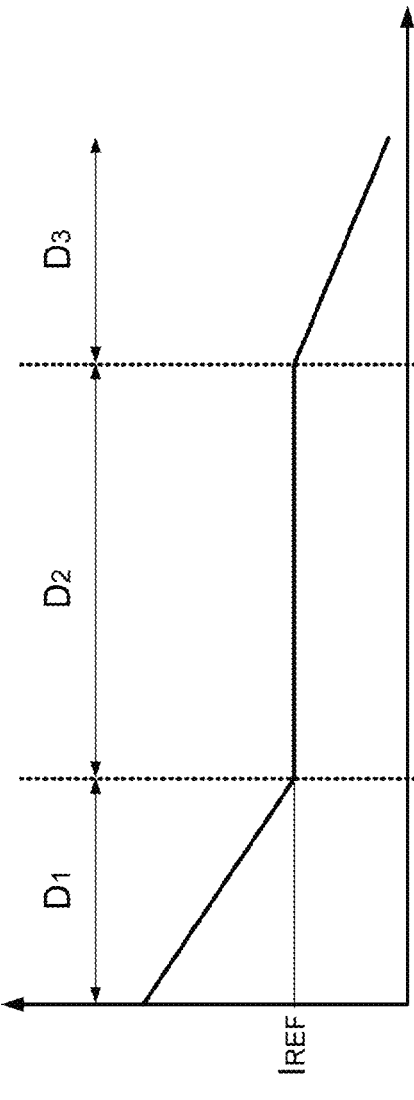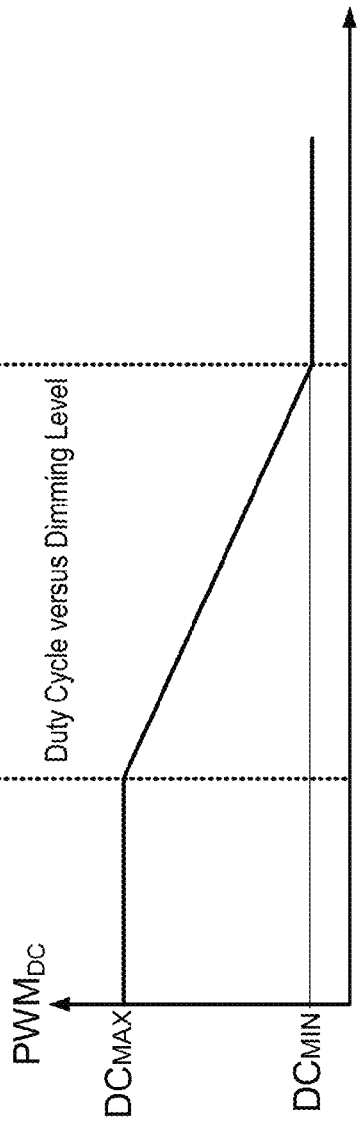
FIG. 3A
FIG. 3B

DIMMABLE LED DRIVING SYSTEM AND METHOD FOR REDUCING FLICKER

CROSS REFERENCE TO RELATED APPLICATION

This present disclosure claims the benefit of U.S. Provisional Application No. 62/196,493 filed on Jul. 24, 2015, which is incorporated by reference herein in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Light emitting diodes (LED) have been popular in electronic device applications, for instance, indicator applications, displays of laboratory instruments, and illumination applications such as home, office, and outdoor lighting. An LED string that includes a plurality of LEDs connected to each other utilizes a current flowing thorough the LEDs for operation.

When an overshoot of the current flowing through the LEDs occurs, the overshoot may produce a brief interval during which light emitted from the LEDs is undesirably bright, such as by producing a flash of light. On the other hand, when the current flowing through the LEDs decreases at a rate greater than a certain value, the change may produce a flickering of light. The occurrence of such a flickering may also depend on a dimming level, a switching frequency in a pulse width modulation (PWM) control system, or the like.

SUMMARY

In an embodiment, a method of controlling a dimmable light emitting diode (LED) system includes defining two or more dimming regions having respective dimming levels applied to one or more strings of LEDs, continuously supplying a current to the one or more strings of LEDs in a first dimming region, and maintaining an average peak value of the current substantially the same and adjusting a duty cycle of a pulse width modulation (PWM) control signal in a second dimming region to supply the current according to the PWM control signal.

In an embodiment, the method further includes maintaining the duty cycle of the PWM control signal and changing the average peak value of the current in a third dimming region.

In an embodiment, the method further includes setting proportional and integral coefficients of a current controller to first and second values, respectively, when a dimming value is in the second dimming region, the proportional coefficient being indicative of a proportional gain of the current controller, the integral coefficient being indicative of an integral gain of the current controller. The method further includes adjusting the proportional and integral coefficients of the current controller to third and fourth values, respectively, during a transitional region between the dimming value being in the second dimming region and the dimming value being in the third dimming region. The third value is smaller than the first value, the fourth value is smaller than the second value, or both. In an embodiment, an apparatus for controlling a dimmable light emitting diode (LED) system includes one or more strings of LED and a driver circuit. The driver circuit continuously supplies a current to the one or more strings of LEDs in a first dimming region. The driver circuit maintains an average peak value of the current substantially the same and adjusts a duty cycle of a pulse width modulation (PWM) control signal in a second dimming region to supply the current according to the PWM control signal.

In an embodiment, the driver circuit further maintains the duty cycle of the PWM control signal and changes the average peak value of the current in a third dimming region.

In an embodiment, the driver circuit includes a current controller. The current controller has first and second values as proportional and integral coefficients, respectively, when a dimming value is in the second dimming region, the proportional coefficient being indicative of a proportional gain of the current controller, the integral coefficient being indicative of an integral gain of the current controller. The current controller has third and fourth values as the proportional and integral coefficients, respectively, during a transitional region between the dimming value being in the second dimming region and the dimming value being in the third dimming region. The third value is smaller than the first value, the fourth value is smaller than the second value, or both

BRIEF DESCRIPTION OF THE DRAWINGS

FIG. 3A illustrates a profile of an average peak magnitude of a string current flowing through an LED string shown in FIG. 2 according to an embodiment.

FIG. 3B illustrates a profile of a duty cycle of a pulse width modulation (PWM) control signal according to an embodiment.

DETAILED DESCRIPTION

Figure 1:
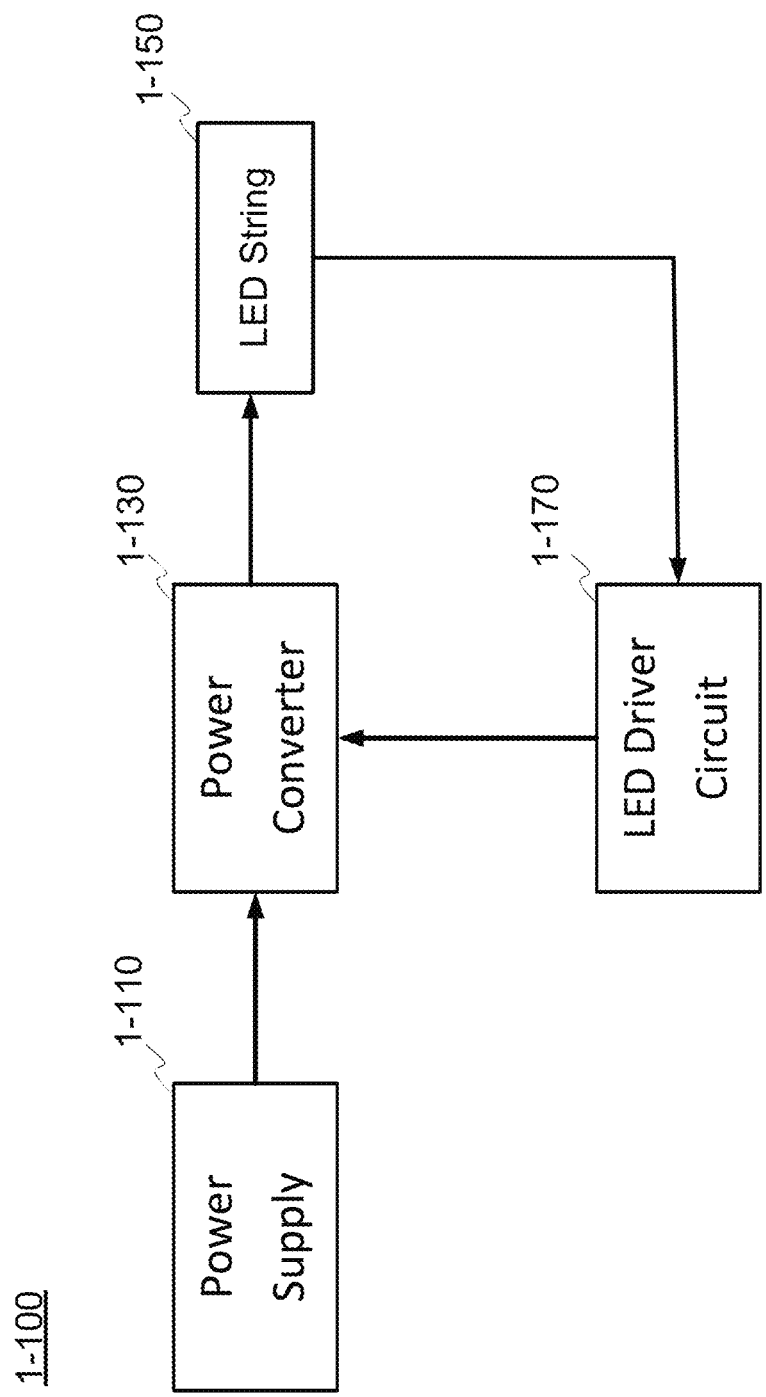
FIG. 1 is a block diagram of an LED system according to an embodiment.

FIG. 1 is a block diagram of an LED system 1-100 according to an embodiment. The LED system 1-100 includes a power supply 1-110, a power converter 1-130, an LED string 1-150, and an LED driver circuit 1-170 according to an embodiment.

The power supply 1-110 provides an alternating current (AC) input voltage to the power converter 1-130.

The power converter 1-130 converts the received AC input voltage to a current (referred to as a string current) flowing through the LED string 1-150. Converting the received AC input voltage to the string current includes, in an embodiment, rectifying the received AC input voltage at the power converter 1-130.

The LED string 1-150 includes a one or more LEDs coupled to together either in series, in parallel, or in combinations thereof. Each of the plurality of LEDs converts a current passing the LED into light. A brightness of light emitted by the LEDs varies with a magnitude of the current flowing through the LED string 1-150.

The LED driver circuit 1-170 adjusts the brightness of light by changing a magnitude of the string current flowing through the LED string 1-150. The LED driver circuit 1-170 also adjusts the brightness of light using a pulse width modulation (PWM) control, which includes a duty cycle corresponding to a ratio of a duration of an "ON" portion (or an active portion) of a PWM cycle to a total duration of the PWM cycle, wherein the PWM cycle includes the "ON" portion and an "OFF" portion (or an inactive portion).

In an embodiment, the LED driver circuit 1-170 includes a microprocessor (not shown) executing computer programming instructions from a non-transitory computer-readable medium. The microprocessor controls the power converter 1-130 to adjust the magnitude of the string current flowing through the LED string 1-150 and controls a PWM cycle of the string current flowing through the LED string 1-150, as disclosed below, to prevent flashing, flickering, or both of the LED string 1-150.

Figure 2:
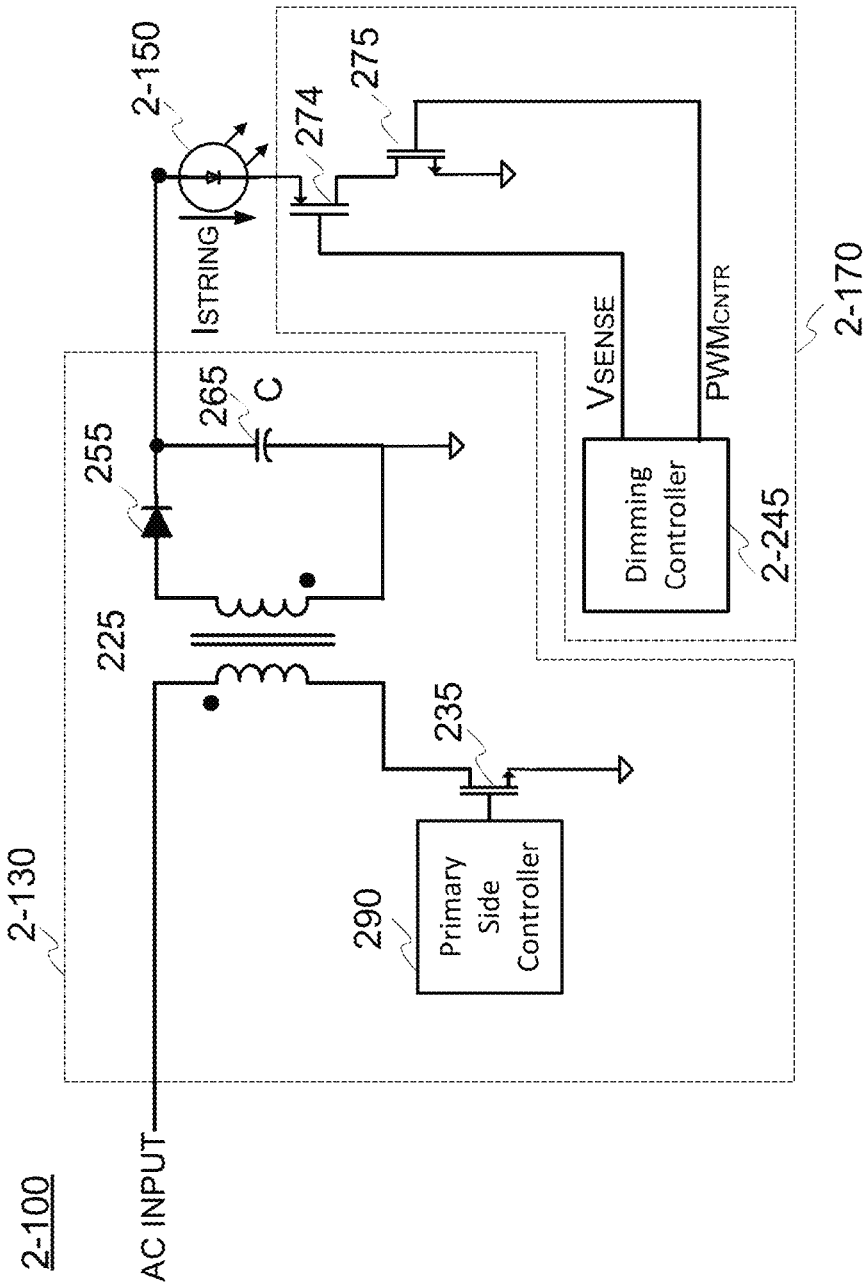
FIG. 2 is a circuit diagram of the LED system of FIG. 1 according to an embodiment.

FIG. 2 is a circuit diagram of a LED system 2-100 suitable for use as the LED system 1-100 of FIG. 1. The LED system 2-100 includes a power converter 2-130, an LED string 2-150, and an LED driver circuit 2-170.

A power supply (e.g., the power supply 1-110 of FIG. 1) provides an AC input signal AC INPUT to the power converter 2-130. In an embodiment, the power converter 2-130 is an AC-to-DC flyback converter, and the AC input signal AC INPUT is applied to a primary winding of a transformer 225. The AC-to-DC flyback converter includes a primary side controller 290 that turns on or off a switching device 235 to adjust an average magnitude of a first AC current flowing through the primary winding of the transformer 225, in an embodiment. The AC-to-DC flyback converter further includes a diode 255 and a capacitor 265, which convert a second AC current flowing through a secondary winding of the transformer 225 into a DC string current $I_{STRING}$. When the primary side controller 290 adjusts the average magnitude of the first AC current flowing through the primary winding, a magnitude of the second AC current flowing through the secondary winding changes, leading to a change in a magnitude of the DC string current $I_{STRING}$ to the LED string 2-150.

Although the LED string 2-150 shown in FIG. 2 is a single string that includes a plurality of LEDs connected in series, embodiments of the present disclosure are not limited thereto. In an embodiment, the LED string 1-150 includes two or more strings coupled in parallel, for example, three strings, each of which includes a corresponding plurality of LEDs that are connected in series.

The LED driver circuit 2-170 includes the dimming controller 2-245, a sensing device 274, and a switching device 275.

The sensing device 274 is connected to the LED string 2-150 and the dimming controller 2-245. In an embodiment, the sensing device 274 is a p-channel metal-oxide semiconductor (PMOS) transistor, a source of the sensing device 274 is connected to the LED string 2-150, and a gate of the sensing device 274 is connected to the dimming controller 2-245 via a switching device 275. Inasmuch as a level of a sense voltage $V_{SENSE}$ at the gate of the sensing device 274 varies with an instantaneous magnitude of the string current $I_{STRING}$, by detecting the level of Vsense, the dimming controller 2-245 can also detect the instantaneous magnitude of the string current $I_{STRING}$. The dimming controller 2-245 can also converts the received sense voltage $V_{SENSE}$ into a sense current that has a magnitude that is substantially equal to an average peak magnitude of the string current $I_{STRING}$. For example, the average peak magnitude of the string current $I_{STRING}$ is a value averaged during an active portion of a PWM cycle of a PWM control signal $PWM_{CTNR}$.

The switching device 275 is connected to the sensing device 274 and the dimming controller 2-245. The switching device 275 is turned on to cause the string current $I_{STRING}$ to flow through the sensing device 274 and the switching device 275 to a ground in response to the PWM control signal $PWM_{CNTR}$.

An operation of the dimming controller 2-245 to control dimming of the LED string 2-150 will be described below in detail with reference to FIGS. 3A and 3B.

In a first dimming region (or a full-on region) $D_1$ shown in FIGS. 3A and 3B, the primary side controller 290 controls the switching device 235 to change an average peak magnitude $I_{STRING,PEAK\_AVG}$ of the string current $I_{STRING}$, for example, the average peak magnitude $I_{STRING,PEAK\_AVG}$ corresponding to an averaged value of the string current $I_{STRING}$ flowing through the LEDs during an active portion of the PWM cycle of the PWM control signal $PWM_{CNTR}$, while the dimming controller 2-245 maintains a duty cycle $PWM_{DC}$ of the PWM control signal $PWM_{CNTR}$ substantially the same as a maximum duty cycle $DC_{MAX}$. In an embodiment, the duty cycle $PWM_{DC}$ of the PWM control signal $PWM_{CNTR}$ in the first dimming region $D_1$ has a value substantially equal to 100%. In the first dimming region $D_1$, to decrease the brightness of the light produced by the LED string 2-150, the average peak magnitude $I_{STRING,PEAK\_AVG}$ of the string current $I_{STRING}$ is decreased and the duty cycle $PWM_{DC}$ of the PWM control signal $PWM_{CNTR}$ is kept substantially the same. Thus, an average magnitude of the string current $I_{STRING}$, which corresponds to an averaged value during the active portion and an inactive portion of the of the PWM cycle of the PWM control signal $PWM_{CNTR}$, is decreased. When the average magnitude of the string current $I_{STRING}$ is decreased, a brightness of light output from the LED string 2-150 decreases. When the average magnitude of the string current $I_{STRING}$ is increased, the brightness of light output from the LED string 2-150 increases. In an embodiment, in the first dimming region $D_1$, the average magnitude of the first AC current flowing through the primary winding of the transformer 225 is greater than that of the second AC current flowing through the secondary winding of the transformer 225. When the LED string 2-150 includes a plurality of LED strings, in an embodiment, a DC current generated by the power converter 2-130 is divided equally to flow thorough the plurality of LED strings. In another embodiment, the DC current generated by the power converter 2-130 is divided unequally in a predetermined ratio. For example, such a ratio is determined to cause currents flowing through the plurality of LED strings to produce white light of a desired color temperature from the plurality of LED strings.

In a second dimming region (or a normal dimming region) $D_2$, the dimming controller 2-245 operates in a PWM control mode, which changes the duty cycle $PWM_{DC}$ of the PWM control signal $PWM_{CNTR}$ while maintaining the average peak magnitude $I_{STRING,PEAK\_AVG}$ of the string current $I_{STRING}$ substantially the same as a magnitude of a reference current $I_{REF}$. In an embodiment, the dimming controller 2-245 includes a PWM controller that decreases or increases the duty cycle $PWM_{DC}$ of the PWM control signal $PWM_{CNTR}$, in order to turn on or off the switching device 275 according to the duty cycle $PWM_{DC}$ of the PWM control signal $PWM_{CNTR}$, thereby decreasing or increasing, respectively, the average magnitude of the string current $I_{STRING}$ and the brightness of light output from the LED string 2-150. In this embodiment, the switching device 275 is an n-channel metal-oxide semiconductor (NMOS) transistor, and a drain of the switching device 275 is connected to the drain of the sensing transistor 274 and a gate of the switching device 275 is connected to the dimming controller 2-245. Although the switching device 275 shown in the embodiment shown in FIG. 2 is an NMOS transistor, embodiments of the present disclosure are not limited thereto. In another embodiment, the switching device 275 is a PMOS transistor (not shown), and a source of the switching device 275 is connected to a drain of the sensing transistor 274 and the gate of the switching device 275 is connected to the dimming controller 2-245.

In a third dimming region (or a deep dimming region) $D_3$, the primary side controller 290 controls the switching device 235 to change the average peak magnitude $I_{STRING,PEAK\_AVG}$ of the string current $I_{STRING}$, while the dimming controller 2-245 maintains the duty cycle $PWM_{DC}$ of the PWM control signal $PWM_{CNTR}$ substantially the same as a minimum duty cycle $DC_{MIN}$. In an embodiment, the minimum duty cycle $DC_{MIN}$ has a value in a range from 3% to 10%. In the third dimming region $D_3$, to decrease the brightness of the light produced by the LED string 2-150, the average peak magnitude $I_{STRING,PEAK\_AVG}$ of the string current $I_{STRING}$ is decreased and the duty cycle $PWM_{DC}$ of the PWM control signal $PWM_{CNTR}$ is kept substantially the same, and thus the average magnitude of the string current $I_{STRING}$ is decreased. In an embodiment, the average magnitude of the first AC current flowing through the primary winding of the transformer 225 is smaller than that of the second AC current flowing through the secondary winding of the transformer 225.

In the normal dimming region $D_2$, the dimming controller 2-245 is configured to minimize a difference between the average peak magnitude $I_{STRING,PEAK\_AVG}$ of the string current $I_{STRING}$ and the magnitude of the reference current $I_{REF}$, in an embodiment. In an embodiment, the current controller of the dimming controller 2-245 minimizes the difference to maintain the average peak magnitude $I_{STRING,PEAK\_AVG}$ of the string current $I_{STRING}$ substantially equal to the magnitude of the reference current $I_{REF}$. An operation of the dimming controller 2-245 in the second dimming region $D_2$ will be described below in detail with reference to FIGS. 4 and 5.

Figure 4:
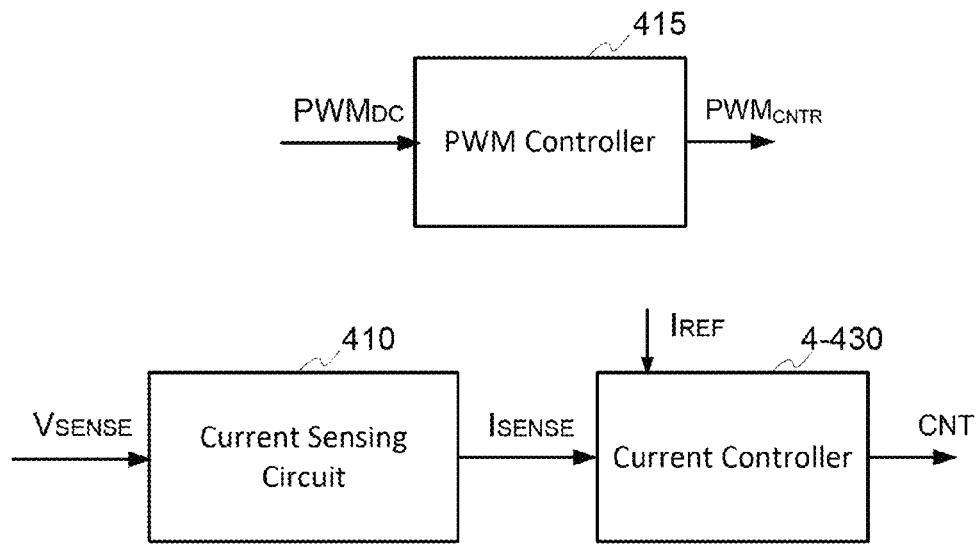
FIG. 4 is a block diagram of a dimming controller of FIG. 2 according to an embodiment.

FIG. 4 is a block diagram of a dimming controller 4-245 suitable for use as the dimming controller 2-245 of FIG. 2 according to an embodiment.

The dimming controller 4-245 includes a PWM controller 415. The PWM controller 415 generates a PWM control signal $PWM_{CNTR}$ based on a signal indicative of a duty cycle $PWM_{DC}$ (e.g., the duty cycle $PWM_{DC}$ of FIG. 3B) of the PWM control signal $PWM_{CNTR}$. In an embodiment, a storage device (not shown) stores predetermined values of the duty cycle $PWM_{DC}$.

The dimming controller 4-245 further includes a current sensing circuit 410 and a current controller 4-430, and outputs a control signal CNT based on a sense voltage $V_{SENSE}$ (e.g., the sense voltage $V_{SENSE}$ of FIG. 2).

The current sensing circuit 410 receives the sense voltage $V_{SENSE}$ from a sensing device (e.g., the sensing device 274 of FIG. 2), and the sense voltage $V_{SENSE}$ varies with a magnitude of a string current (e.g., the string current $I_{STRING}$ of FIG. 2) flowing through an LED string (e.g., the LED string 2-150). The current sensing circuit 410 converts the received sense voltage $V_{SENSE}$ into a sense current $I_{SENSE}$ that is indicative of the string current. In an embodiment, the sense current $I_{SENSE}$ has a magnitude that is substantially equal to an average peak magnitude (e.g., the average peak magnitude $I_{STRING,PEAK\_AVG}$ of FIG. 3A) of the string current.

The current controller 4-430 receives the sense current $I_{SENSE}$ and a reference current $I_{REF}$ (e.g., the reference current $I_{REF}$ of FIG. 3A). In an embodiment, the reference current $I_{REF}$ has a substantially constant magnitude and is stored in a storage device (not shown).

In an embodiment, the current controller 4-430 includes a proportional-integral (PI) controller to minimize a difference between the magnitude of the reference current $I_{REF}$ and the magnitude of the sense current $I_{SENSE}$, which corresponds to the average peak magnitude of the string current during active portions of PWM cycles of a PWM control signal (e.g., the PWM control signal $PWM_{CNTR}$ of FIG. 2). For example, during the second dimming region $D_2$ of FIGS. 3A and 3B, the PI controller maintains the average peak magnitude $I_{STRING,PEAK\_AVG}$ of the string current substantially equal to the magnitude of the reference current $I_{REF}$. An operation of the current controller 4-430 that includes a PI controller will be described below in detail with reference to FIG. 5.

Figure 5:
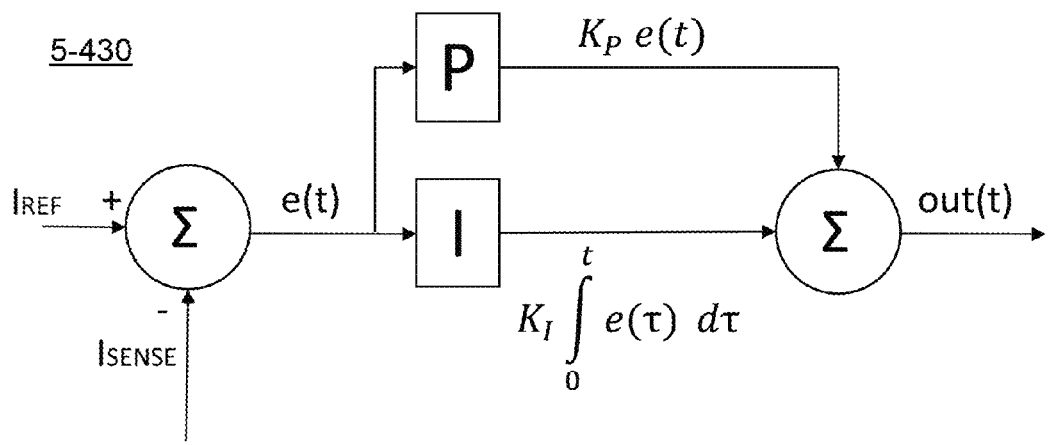
FIG. 5 is a block diagram of a Proportional-Integral (PI) controller included in a current controller of FIG. 4 according to an embodiment.

FIG. 5 is a block diagram of a PI controller 5-430 included in the current controller 4-430 of FIG. 4 according to an embodiment. The PI controller 5-430 receives the reference current $I_{REF}$ and the sense current $I_{SENSE}$, and generates an output signal out(t) at a time t that is represented as follows:

$$\text{out}(t) = K_P e(t) + K_I \int_0^t e(\tau) d\tau$$

In the above Equation, e(t) denotes an error value corresponding to a difference, at the time t, between a magnitude of the reference current $I_{REF}$ and a magnitude of the sense current $I_{SENSE}$, $K_P$ denotes a proportional coefficient, and $K_I$ denotes an integral coefficient of the PI controller 5-430.

A different portion of the current controller 4-430 of FIG. 4 generates the control signal CNT based on the output signal out(t) of the PI controller 5-430, in order to minimize the difference between the magnitude of the reference current $I_{REF}$ and the magnitude of the sense current $I_{SENSE}$. In an embodiment, the output signal out(t) of the PI controller 5-430 is substantially the same signal as the control signal CNT, and the PWM controller 415 of FIG. 4 receives the control signal CNT to adjust a level of an output voltage (e.g., the PWM control signal $PWM_{CNTR}$ of FIG. 2) applied to a gate of a switching device (e.g., the switching device 275 of FIG. 2). For example, when the magnitude of the sense current $I_{SENSE}$ is smaller than that of the reference current $I_{REF}$, the PWM controller 415 increases the level of the voltage applied to the gate of the switching device 275 in response to the control signal CNT, and thus an average peak magnitude of a string current flowing through the switching device 275 is increased, leading to an increase in the magnitude of the sense current $I_{SENSE}$.

Figure 6:
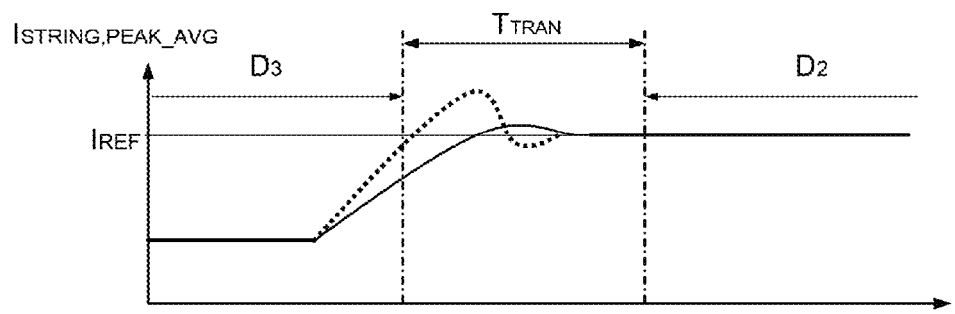
FIG. 6 illustrates a transitional region according to an embodiment.

FIG. 6 illustrates a transitional region when a dimming level transitions from the third region $D_3$ to second dimming region $D_2$ according to an embodiment.

Referring to FIG. 6, in the third dimming region (or deep dimming region) $D_3$, a PI controller (e.g., the PI controller 5-430 of FIG. 5) does not perform a closed-loop control. On the other hand, in the second dimming region (or normal dimming region) $D_2$, the PI controller performs a closed-loop control as described above with reference to FIG. 5.

An average peak magnitude $I_{STRING,PEAK\_AVG}$ of the string current $I_{STRING}$, which corresponds to a sense current $I_{SENSE}$ (e.g., the sense current $I_{SENSE}$ of FIG. 5), has a first steady-state value in the deep dimming region $D_3$ and a second steady-state value in the normal dimming region $D_2$. The second steady-state value in the normal dimming region $D_2$ is substantially equal to the magnitude of a reference current $I_{REF}$ (e.g., the reference current $I_{REF}$ of FIG. 3A).

In the deep dimming region $D_3$ and the normal dimming region $D_2$, a proportional coefficient $K_p$ and an integral coefficient $K_I$ of the PI controller have first and second constant values, respectively. In an embodiment, the first constant value of the proportional coefficient $K_p$ is in a range from 2 to 256. In an embodiment, the second constant value of the integral coefficient $K_I$ is in a range from 4 to 4096.

In an embodiment, the PI controller enters a transitional region having a transitional period $T_{TRAN}$ when the dimming level changes from a first dimming level corresponding to the deep dimming region $D_3$ to a second dimming level corresponding to the normal dimming region $D_2$. During the transitional region, at least one of the proportional coefficient $K_P$ and an integral coefficient $K_I$ of the PI controller has a substantially lower values than the respective values of the proportional coefficient $K_P$ and the integral coefficient $K_I$ when the dimming level is in the normal dimming region $D_2$ and the PI is not in the transitional region. The proportional coefficient $K_P$ has a third constant value and the integral coefficient $K_I$ has a fourth constant value.

In an embodiment, the third constant value for the proportional coefficient $K_P$ is any one of 4, 8, 16, and 128 when the first constant value is 256, and the fourth constant value for the integral coefficient $K_I$ is any one of 4, 8, 16, and 64 when the second constant value is 64. In an embodiment, one or more of the first, second, third, and fourth constant values are programmable. For example, the one or more of the first, second, third, and fourth constant values can be input using a user interface (not shown) in a calibration process of a prototype LED system (e.g., the LED system 1-100 of FIG. 1), and the determined values can be stored in a storage device (not shown). In an embodiment, the determined values can be stored in a read-only memory (ROM), a one-time programmable (OTP) memory, or the like.

The PI controller remains in the transitional region until the PI controller determines that a value of the average peak magnitude of the string current $I_{STRING}$ has settled to a target value, such as the reference current $I_{REF}$. In an embodiment, the PI controller determines that the value has settled when an error value (e.g., the error value e(t) of FIG. 5) has been substantially equal to zero for a predetermined number of cycles of the PI controller's control loop. For example, the PI controller determines that the value has settled when the error value between the value and the target value becomes equal to or less than a predetermined percentage (e.g., 3%, 5%, or 10%) of the target value. In an embodiment, the PI controller may determine that the value has settled when the error value has been substantially equal to zero for one of 64, 128, 192, or 256 cycles of a PWM control signal (e.g., the PWM control signal $PWM_{CNTR}$ of FIG. 2), since the PI controller enters the transition region. In an embodiment, the number of cycles of the PWM control signal corresponding to the transitional period $T_{TRAN}$ of the transitional region may be programmable.

In the transitional region, a first profile (indicated as the solid line of FIG. 6) of the average peak magnitude $I_{STRING,PEAK\_AVG}$ of the string current $I_{STRING}$ according to an embodiment of the present disclosure has a reduced overshoot (i.e., a difference between the maximum magnitude of a corresponding profile and the magnitude of the reference current $I_{REF}$) compared to a second profile (indicated as the dashed line of FIG. 6B) when the proportional coefficient $K_P$ and the integral coefficient $K_I$ have the first and second constant values, respectively. In addition, the first profile of the average peak magnitude $I_{STRING,PEAK\_AVG}$ of the string current $I_{STRING}$ according to an embodiment of the present disclosure drops at a slower rate compared to the second profile. Because the third and fourth constant values of the PI controller in the transitional region cause the average peak magnitude $I_{STRING,PEAK\_AVG}$ of the string current $I_{STRING}$ to change at such a low rate, a flash, a flicker, or both, is not be observed.

Figure 7A:
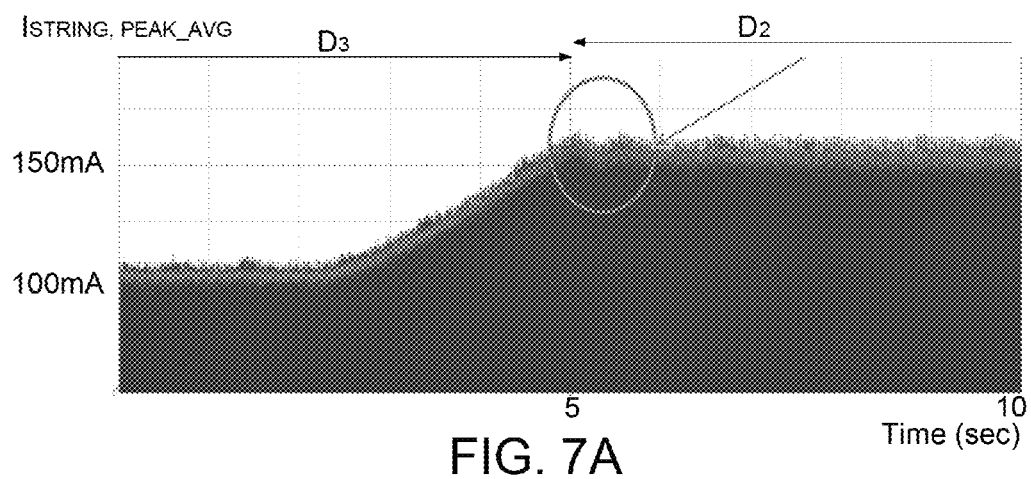
FIG. 7A illustrates a profile of a string current in an LED system that includes a conventional current controller.

FIG. 7A illustrates a profile of an average peak magnitude $I_{STRING,PEAK\_AVG}$ of a string current $I_{STRING}$ in an LED system that includes a conventional current controller. Such a conventional current controller includes a PI controller having constant proportional and integral coefficients in a plurality of dimming regions.

Referring to FIG. 7A, the average peak magnitude $I_{STRING,PEAK\_AVG}$ of the string current $I_{STRING}$ has a first steady-state value (e.g., 110 mA) in a deep dimming region $D_3$ and a second steady-state value (e.g., 150 mA) in a normal dimming region $D_2$. As indicated in the solid circle in FIG. 7A, the average peak magnitude $I_{STRING,PEAK\_AVG}$ of the string current $I_{STRING}$ rises and then drops at a first rate that is sufficiently high to cause a flash, a flicker, or both.

Figure 7B:
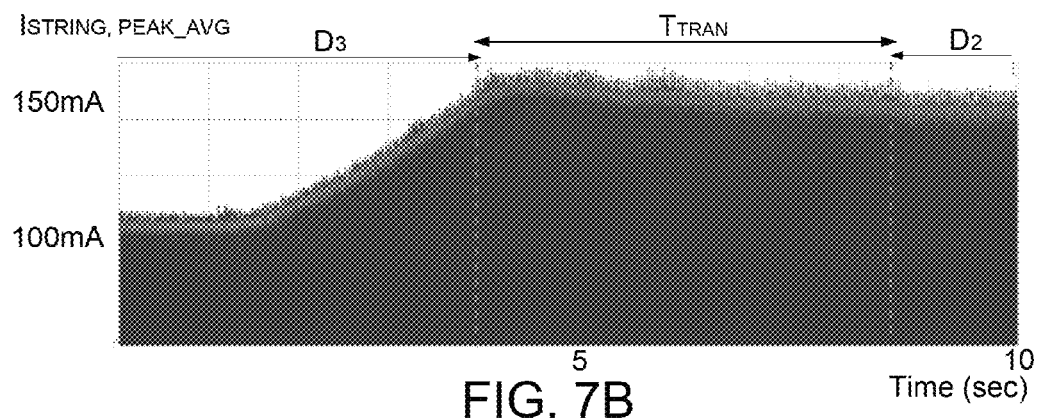
FIG. 7B illustrates a profile of a string current in an LED system that includes the current controller shown in FIG. 4 according to an embodiment.

FIG. 7B illustrates a profile of an average peak magnitude $I_{STRING,PEAK\_AVG}$ of a string current $I_{STRING}$ in an LED system that includes a current controller (e.g., the current controller 4-430 of FIG. 4) according to an embodiment. Such a current controller includes a PI controller (e.g., the PI controller 5-430 of FIG. 5), and at least one of proportional and integral coefficients of the PI controller is smaller in a transitional region having a transitional period (e.g., the transitional period $T_{TRAN}$ of FIG. 6) than a corresponding one of the proportional and integral coefficients used in a normal dimming regions $D_2$ outside of the transitional region. In an embodiment, at least one of proportional and integral coefficients of the PI controller is smaller in the transitional region than a corresponding one of the proportional and integral coefficients used in the normal dimming region $D_2$ and in a deep dimming region $D_3$.

Referring to FIG. 7B, the average peak magnitude $I_{STRING,PEAK\_AVG}$ of the string current $I_{STRING}$ has a first steady-state value (e.g., 110 mA) in the deep dimming region $D_3$ and a second steady-state value (e.g., 150 mA) in the normal dimming region $D_2$. Because at least one of the proportional and integral coefficients in the transition region is smaller than a corresponding one of the proportional and integral coefficients used in the normal dimming regions $D_2$ outside of the transitional region, the average peak magnitude $I_{STRING,PEAK\_AVG}$ of the string current $I_{STRING}$ rises and then drops at a second rate that is sufficiently low not to cause a flash, a flicker, or both.

Figure 8:
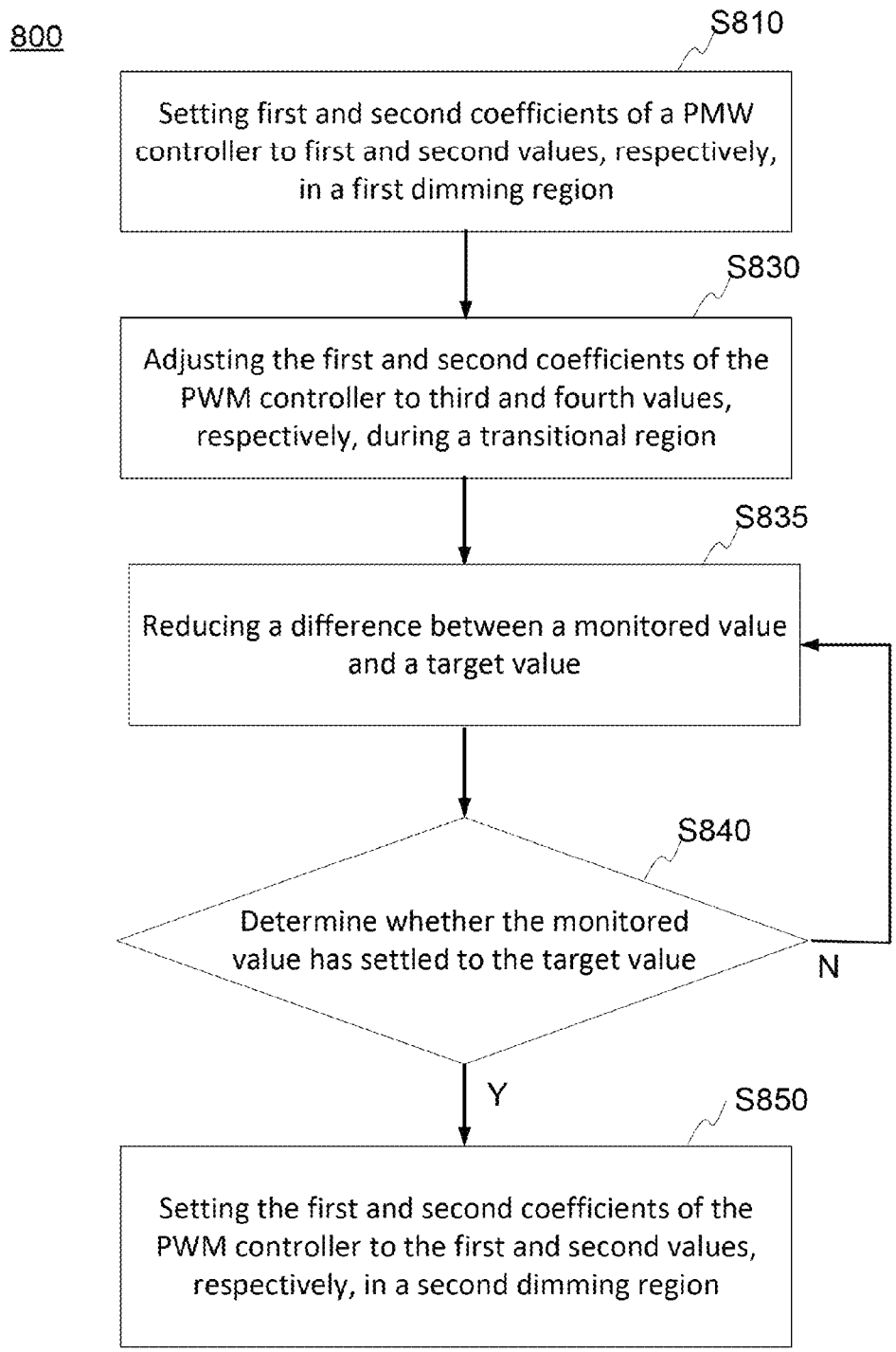
FIG. 8 is a flowchart that illustrates a process performed by an LED driver circuit of FIG. 1 according to an embodiment.

FIG. 8 is a flowchart that illustrates a process 800 performed by an LED driver circuit (e.g., the LED driver circuit 2-170 of FIG. 2) according to an embodiment. In this embodiment, the LED driver circuit includes a current controller (e.g., the current controller 4-430 of FIG. 4)

At S810, the LED driver circuit sets first and second coefficients of the current controller to first and second values, respectively, in a first dimming region. The first dimming region may be a deep dimming region, that is, a region in which a PWM duty cycle of the LED driver circuit controller is fixed at a predetermined minimum value. In an embodiment, the first and second coefficients are proportional and integral coefficients of a PI controller, respectively.

At S830, the LED driver circuit enters a transitional region between the first dimming region and a second dimming region, that is, when a dimming level transitions from being in the first dimming region to being in the second dimming region. When the LED driver circuit enters the transitional region, the LED driver circuit adjusts the first and second coefficients of the current controller to third and fourth values, respectively. In an embodiment, the third constant value in the transitional region is smaller than the first constant value in the first and second dimming regions, the fourth constant value in the transition region is smaller than the second constant value in the first and second dimming regions, or both. In an embodiment, the third and fourth values of the PI controller are determined such that an average peak magnitude of a string current changes at a sufficiently low rate to prevent a flash, a flicker, or both of an LED system. In an embodiment, the third and fourth values of the PI controller and a transitional period of the transitional region are programmable.

At S835, the LED the LED driver circuit reduces a difference between a monitored value (e.g., a sense current $I_{SENSE}$ of FIG. 4) and a target value (e.g., a reference current $I_{REF}$ of FIG. 4). In an embodiment, the PI controller is used to minimize the difference between the monitored value and the target value.

At S840, the LED driver circuit determines whether the monitored value has settled to the target value. In an embodiment, the LED driver circuit determines that the monitored value has settled to the target value when an error value corresponding to a difference between the monitored value and the target value has been substantially equal to zero for a predetermined number of cycles of a PWM control signal (e.g., the PWM control signal $PWM_{CNTR}$ of FIG. 2). In an embodiment, the predetermined number of cycles is programmable. When the target value has settled, the process 800 proceeds to S850. Otherwise, the process 800 proceeds to S835.

At S850, the LED driver circuit sets the first and second coefficients of the current controller to the first and second values, respectively, in the second dimming region. In the second dimming region, the current controller changes a duty cycle of a PWM control signal to control a brightness of a LED string included in the LED system.

Figure 9:
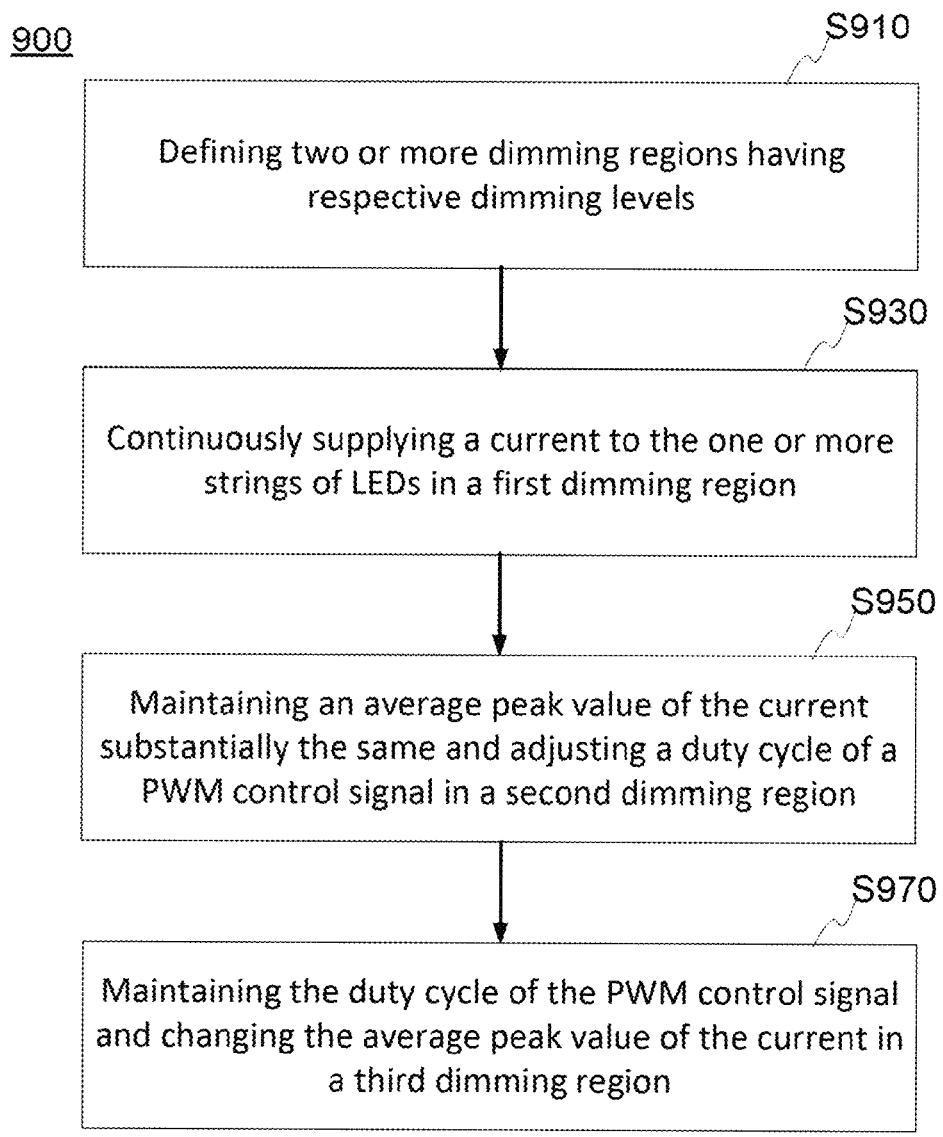
FIG. 9 is flowchart that illustrates a process performed by an LED driver circuit of FIG. 1 according to an embodiment

FIG. 9 is a flowchart that illustrates a process 900 performed by an LED driver circuit (e.g., the LED driver circuit 2-170 of FIG. 2) according to an embodiment. In this embodiment, the LED driver circuit includes a current controller (e.g., the current controller 4-430 of FIG. 4) and a PWM controller (e.g., the PWM controller 415 of FIG. 4).

At S910, two or more dimming regions having respective dimming levels applied to one or more strings of LEDs are defined. The two or more dimming regions include first, second, and third dimming regions.

At S930, the LED driver circuit continuously supplies a current to the one or more strings of LEDs in the first dimming region. In an embodiment, in the first dimming region, the PWM controller outputs a PWM control signal having a duty cycle that is substantially equal to 100%.

At S950, the LED driver circuit maintains an average peak value of the current substantially the same and adjusting the duty cycle of the PWM control signal in the second dimming region to supply the current according to the PWM control signal.

At S970, the LED driver circuit maintains the duty cycle of the PWM control signal and changes the average peak value of the current in the third dimming region. In an embodiment, the PWM controller outputs the PWM control signal having the duty cycle that is in a range from 3% to 10%.

Aspects of the present disclosure have been described in conjunction with the specific embodiments thereof that are proposed as examples. Numerous alternatives, modifications, and variations to the embodiments as set forth herein are possible without departing from the scope of the claims set forth below. Accordingly, embodiments as set forth herein are intended to be illustrative and not limiting.

What is claimed is:

1. A method of controlling a dimmable light emitting diode (LED) system comprising:
   defining two or more dimming regions having respective dimming levels applied to one or more strings of LEDs, the two or more dimming regions including first, second, and third dimming regions;
   continuously supplying a current to the one or more strings of LEDs in the first dimming region;
   maintaining an average peak value of the current and adjusting a duty cycle of a pulse width modulation (PWM) control signal in the second dimming region to supply the current according to the PWM control signal;
   maintaining the duty cycle of the PWM control signal and changing the average peak value of the current in the third dimming region;
   setting a proportional coefficient and an integral coefficient of a current controller to a first value and a second value, respectively, when a dimming value is in the second dimming region, the proportional coefficient corresponding to a change in an output value of the current controller caused by an error, the integral coefficient corresponding to a change in the output value of the current controller caused by an accumulated error; and
   adjusting the proportional coefficient and the integral coefficient of the current controller to a third value and a fourth value, respectively, during a transitional region when the dimming value is between the second dimming region and the third dimming region, the third value being smaller than the first value, the fourth value being smaller than the second value, or both.

2. The method of claim 1, wherein the transitional region occurs as a result of the dimming value transitioning from being in the third dimming region to being in the second dimming region.

3. The method of claim 1, further comprising:
   converting a sense voltage into a sense current, the sense current having a magnitude that is indicative of the average peak magnitude of the current supplied to the one or more strings of LEDs, the average peak magnitude corresponding to an average value of the current during an active portion of a PWM cycle of the PWM control signal; and minimizing a difference between the magnitude of the sense current and a magnitude of a reference current using the current controller.

4. The method of claim 3, further comprising:
determining whether the difference between the magnitude of the sense current and the magnitude of the reference current is substantially equal to zero.

5. The method of claim 4, further comprising:
exiting the transitional region when the difference is determined to be substantially equal to zero for a predetermined number of cycles during the transitional region.

6. The method of claim 3, further comprising determining whether the magnitude of the sense current has settled to the magnitude of the reference current for a predetermined number of cycles, the predetermined number of cycles being programmable and corresponding to any one of 64, 128, 192, and 256 cycles of the PWM control signal output from a PWM controller.

7. The method of claim 1, further comprising setting the third value to any one of 4, 8, 16, and 128, and setting the fourth value to any one of 4, 8, 16, and 64.

8. The method of claim 1, further comprising dividing the current into the one or more LED strings substantially equally.

9. The method of claim 1, further comprising:
setting the proportional coefficient and the integral coefficient of the current controller to the first value and the second value, respectively, when a dimming value is in the third dimming region.

10. The apparatus of claim 1, wherein the proportional coefficient is a coefficient for the change in the output value of the current controller caused by the error, and the integral coefficient is a coefficient for the change in the output value of the current controller caused by the accumulated error.

11. An apparatus for controlling a dimmable light emitting diode (LED) system, the apparatus comprising:
one or more strings of LED; and
a driver circuit to continuously supply a current to the one or more strings of LEDs in a first dimming region, to maintain an average peak value of the current and adjust a duty cycle of a pulse width modulation (PWM) control signal in a second dimming region to supply the current according to the PWM control signal, and to maintain the duty cycle of the PWM control signal and change the average peak value of the current in a third dimming region,
wherein the driver circuit includes a current controller, and the current controller has a first value and a second value as a proportional coefficient and an integral coefficient, respectively, when a dimming value is in the second dimming region, the proportional coefficient corresponding to a change in an output value of the current controller caused by an error, the integral coefficient corresponding to a change in the output value of the current controller caused by an accumulated error, and
wherein the current controller has a third value and a fourth value as the proportional coefficient and the integral coefficient, respectively, during a transitional region when the dimming value is between the second dimming region and the third dimming region, the third value being smaller than the first value, the fourth value being smaller than the second value, or both.

12. The apparatus of claim 11, wherein the transitional region occurs as a result of the dimming value transitioning from being in the third dimming region to being in the second dimming region.

13. The apparatus of claim 12, wherein the driver circuit further includes a current sensing circuit to convert a sense voltage into a sense current, the sense current having a magnitude that is indicative of the average peak magnitude of the current supplied to the one or more strings of LED, the average peak magnitude corresponding to an average value of the current during an active portion of a PWM cycle of the PWM control signal, and
wherein the current controller minimizes a difference between the magnitude of the sense current and a magnitude of a reference current.

14. The apparatus of claim 13, wherein the driver circuit determines whether the difference between the magnitude of the sense current and the magnitude of the reference current is substantially equal to zero.

15. The apparatus of claim 14, wherein the driver circuit sets the proportional coefficient and the integral coefficient of the current controller to the first value and the second value, respectively, and exiting the transitional region when the difference is determined to be substantially equal to zero for a predetermined number of cycles during the transitional region.

16. The apparatus of claim 13, wherein the predetermined number of cycles is programmable and corresponds to any one of 64, 128, 192, and 256 cycles of the PWM control signal output from a PWM controller.

17. The apparatus of claim 11, wherein the third value is programmable and is any one of 4, 8, 16, and 128, and
wherein the fourth value is programmable and is any one of 4, 8, 16, and 64.

18. The apparatus of claim 11, wherein the one or more strings of LED are coupled in parallel to each other, each of the strings of LED including a plurality of LEDs coupled in series.

19. A method of controlling a dimmable light emitting diode (LED) system comprising:
maintaining a duty cycle of a pulse width modulation (PWM) control signal and changing an average peak value of a current in a first dimming region, the current being supplied to one or more strings of LEDs according to the PWM control signal;
maintaining the average peak value of the current and adjusting the duty cycle of the PWM control signal in a second dimming region;
maintaining the duty cycle of the PWM control signal and changing the average peak value of the current in a third dimming region;
setting a proportional coefficient and an integral coefficient of a current controller to a first value and a second value, respectively, when a dimming value is in the third dimming region, the proportional coefficient being associated with a change in an output value of the current controller caused by an error, the integral coefficient being associated with a change in the output value of the current controller caused by an accumulated error; and
adjusting the proportional coefficient and the integral coefficient of the current controller to a third value and a fourth value, respectively, during a transitional region when the dimming value is between the second dimming region and the third dimming region, the third value being smaller than the first value, the fourth value being smaller than the second value, or both.

20. The method of claim 19, further comprising:
setting the proportional coefficient and the integral coefficient of the current controller to the first value and the second value, respectively, when the dimming value is in the second dimming region.

* * * * *